(12) United States Patent
Lee et al.

(10) Patent No.: US 6,362,962 B1
(45) Date of Patent: Mar. 26, 2002

(54) CLIP FOR HEAT SINK

(75) Inventors: Hsieh Kun Lee, Chung-Ho (TW); Zhi Sheng Lin, Shen Zhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/678,949

(22) Filed: Oct. 3, 2000

(30) Foreign Application Priority Data

Jul. 10, 2000 (TW) .................................. 089211857 U

(51) Int. Cl.⁷ .............................................. H05K 7/20
(52) U.S. Cl. ...................... 361/704; 361/707; 361/709; 361/710; 257/706; 257/718; 257/719; 257/722; 257/727; 174/16.3; 165/80.3; 411/516; 24/458
(58) Field of Search ................................ 361/687, 703, 361/704, 709, 710, 717–719; 174/16.3; 165/80.3, 185; 257/718, 719, 727; 24/293, 295, 453, 457, 458, 513, 520, 495

(56) References Cited

U.S. PATENT DOCUMENTS 5,617,292 A * 4/1997 Steiner ........................ 361/704
5,953,212 A * 9/1999 Lee ............................. 361/709
6,205,026 B1 * 3/2001 Wong et al. ................. 361/704
6,226,186 B1 * 5/2001 Chien ......................... 361/704

* cited by examiner

Primary Examiner—Leo P. Picard
Assistant Examiner—Doris L. Chervinsky
(74) Attorney, Agent, or Firm—Wei Te Chung

(57) ABSTRACT

A clip (30) for securing a heat sink (50) to a heat-generating electronic device (90) includes first and second fasteners (40, 60). The first fastener includes a body (41), and a pair of legs (49) depending from respective opposite ends of the body. The body has a stretch portion (411) in which cutouts (413) are defined to form a pair of fixing tabs (415). A pair of spring pressing portions (43) is formed at respective opposite ends of the body. Each spring pressing portion has a pressing tab (451) to be received in a slot (53) defined in the heat sink. The second fastener has a vertical panel (61) defining an opening (62) adapted to receive a clasp (72) of a retention module (70), and a slot (63) for receiving the fixing tabs of the first fastener therethrough. The fixing tabs are then deformed to secure the second fastener to the first fastener.

17 Claims, 4 Drawing Sheets

CLIP FOR HEAT SINK

BACKGROUND OF THE INVENTION

1. Field of the Invention

The present invention relates to an apparatus for attaching a heat sink to a heat-generating electronic device, and particularly to a clip for readily securing a heat sink to a central processing unit (CPU).

2. The Related Art

Many electronic devices, such as central processing units (CPUs), generate a lot of heat during operation This deteriorates the operational stability of such devices, and can lead to damage. A heat sink is often attached to a surface of the electronic device for removing heat. Various clips can be used to mount the heat sink to the electronic device.

A conventional clip includes a pressing portion and a pair of legs depending from opposite ends of the pressing portion. Each leg defines an aperture for engaging with a catch formed on a retention module on which the electronic device is supported. The pressing point of the clip, which acts on the heat sink, usually does not coincide with the center of the clip. Therefore an eccentric movement may occur between the pressing point and the center of the clip. This can cause relative movement between the clip and the heat sink during normal operation of the electronic device, thereby dislodging the heat sink.

To overcome the above problem, another kind of conventional clip includes a fixing tab formed at a central portion of the clip. The fixing tab defines an aperture for receiving a catch formed at a corresponding portion of the corresponding retention module, thereby preventing the heat sink from moving. However, since the fixing tab integrally extends from the clip at a central portion thereof, the clip engages with the retention module in-cross directions. This complicates assembly and disassembly of the heat sink and electronic device.

Examples of the above conventional clips are disclosed in Taiwan Patent Applications Nos. 85211135, 85214941 and 86213035, and in U.S. Pat. Nos. 5,602,719 and 5,600,540.

SUMMARY OF THE INVENTION

Accordingly, an object of the present invention is to provide a clip for readily attaching a heat sink to an electronic device, and for readily detaching the heat sink therefrom.

Another object of the present invention is to provide a clip for securely attaching a heat sink to an electronic device.

In order to achieve the above objects, a clip for securing a heat sink to a heat-generating electronic device includes first and second fasteners. The first fastener includes a body, and a pair of legs depending from respective opposite ends of the body. Each leg defines an aperture for engaging with an external catch of a corresponding retention module. A central portion of the body has a stretch portion on which cutouts are defined to form a pair of fixing tabs. A pair of spring pressing portions is formed at respective opposite ends of the body. Each pressing portion has a pressing tab to be received in a corresponding slot defined in the heat sink. The second fastener has a vertical panel defining an opening adapted to receive an external clasp of the corresponding retention module. The second fastener also has a slot for receiving the fixing tabs of the first fastener therethrough. The fixing tabs are then deformed to secure the second fastener to the first fastener.

Other objects, advantages and novel features of the present invention will be drawn from the following detailed embodiment of the present invention with attached drawings, in which:

DETAILED DESCRIPTION OF THE PREFERRED EMBODIMENT

Figure 1:
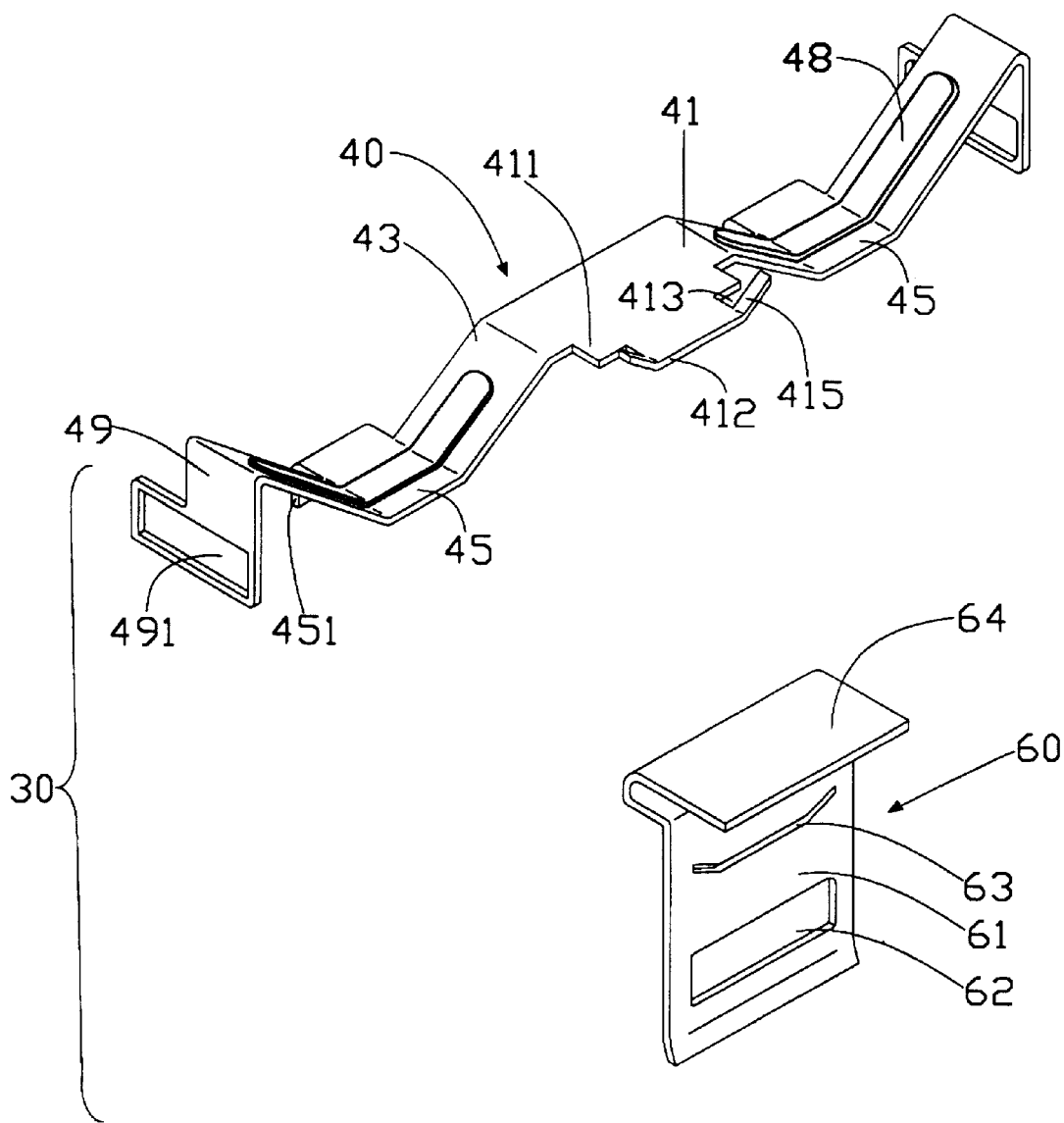
FIG. 1 is an exploded view of a clip in accordance with the present invention.

Referring to FIG. 1, a clip 30 in accordance with the present invention comprises a first fastener 40, and a second fastener 60 attached to the first fastener 40.

The first fastener 40 comprises a central body 41 and a pair of legs 49. A stretch portion 411 extends horizontally from a lateral edge of a central portion (not labeled) of the body 41. The stretch portion 411 defines a pair of cutouts 413 in respective opposite side edges thereof. Thus the stretch portion 411 forms a pair of fixing tabs 415 on respective opposite sides thereof, adjacent the cutouts 413. The fixing tabs 415 are bent upwards, and together with the stretch portion 411 form a U-shaped plug 412. The body 41 further has a pair of spring pressing portions 43 extending from respective opposite ends of the central portion (not labeled) thereof. Each spring pressing portion 43 includes a central horizontal portion 45, and a pressing tab 451 depending vertically from a lateral edge of the horizontal portion 45. Viewing the first fastener 40 as a whole, the pressing tabs 451 depend from a lateral edge opposite to the lateral edge from which the stretch portion 411 extends. Each spring pressing portion 43 also includes a rib 48 formed on an upper surface thereof for reinforcing purposes. The legs 49 depend vertically from respective opposite ends of the body 41. Each leg 49 defines an aperture 491 therethrough.

The second fastener 60 includes a handle 64, and a vertical panel 61. The handle 64 is partially U-shaped for resiliency, and is substantially perpendicular to the vertical panel 61. The vertical panel 61 depends vertically from a lower end of the handle 64. The vertical panel 61 defines an opening 62 and a slot 63. The opening 62 is located below the slot 63. The slot 63 is dimensioned to receive the plug 412 of the first fastener 40 therethrough.

Figure 2:
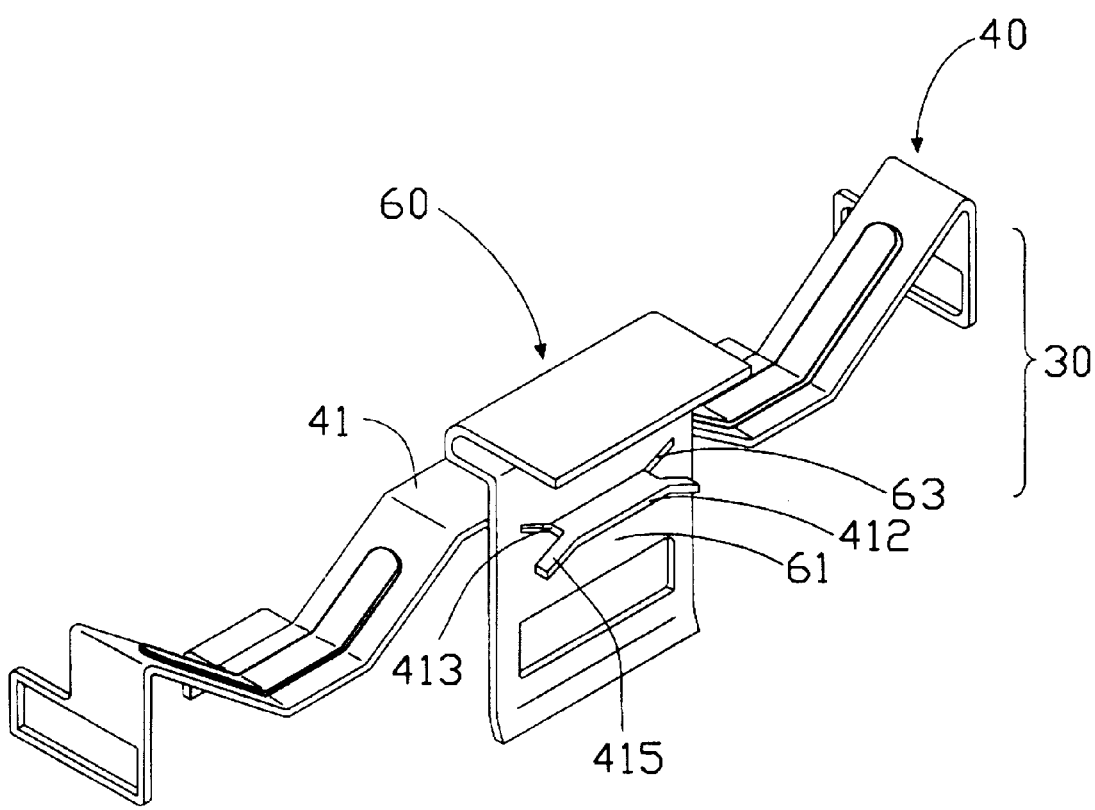
FIG. 2 is an assembled view of FIG. 1.

Referring to FIG. 2, in pre-assembly, the plug 412 of the body 41 of the first fastener 40 is inserted into the slot 63 of the second fastener 60. The plug 412 is inserted until the vertical panel 61 of the second fastener 60 can travel no further, at which point the vertical panel 61 occupies the space defined by the cutouts 413. At this point, the vertical panel 61 is located inwardly from the plug 412. The fixing tabs 415 of the first fastener 40 are then deformed downwardly, to retain the second fastener 60 to the first fastener 40. Thus the clip 30 is now a single unit.

Figure 3:
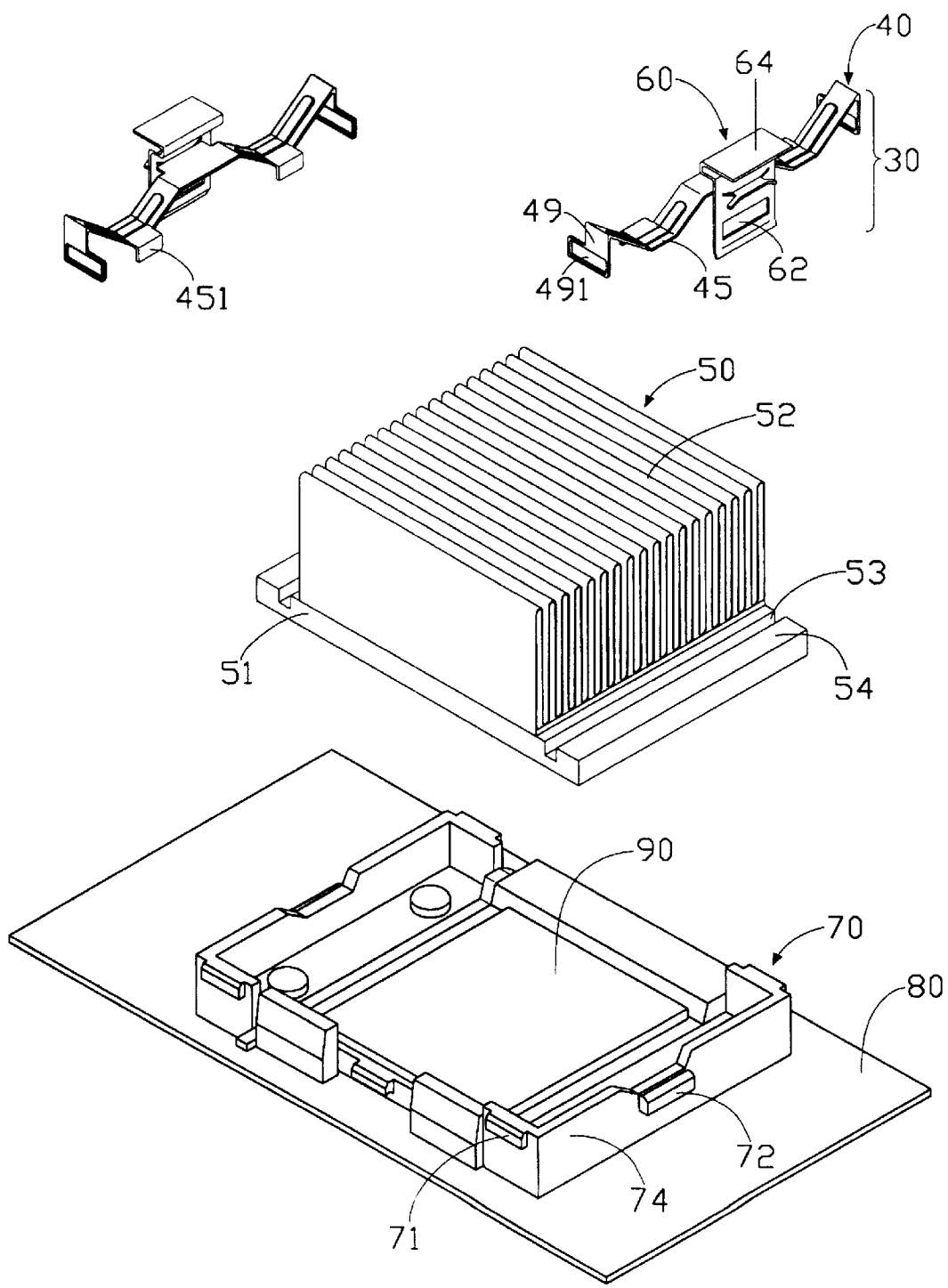
FIG. 3 is an exploded view showing two clips of the present invention used for attaching a heat sink to an electronic device.
Figure 4:
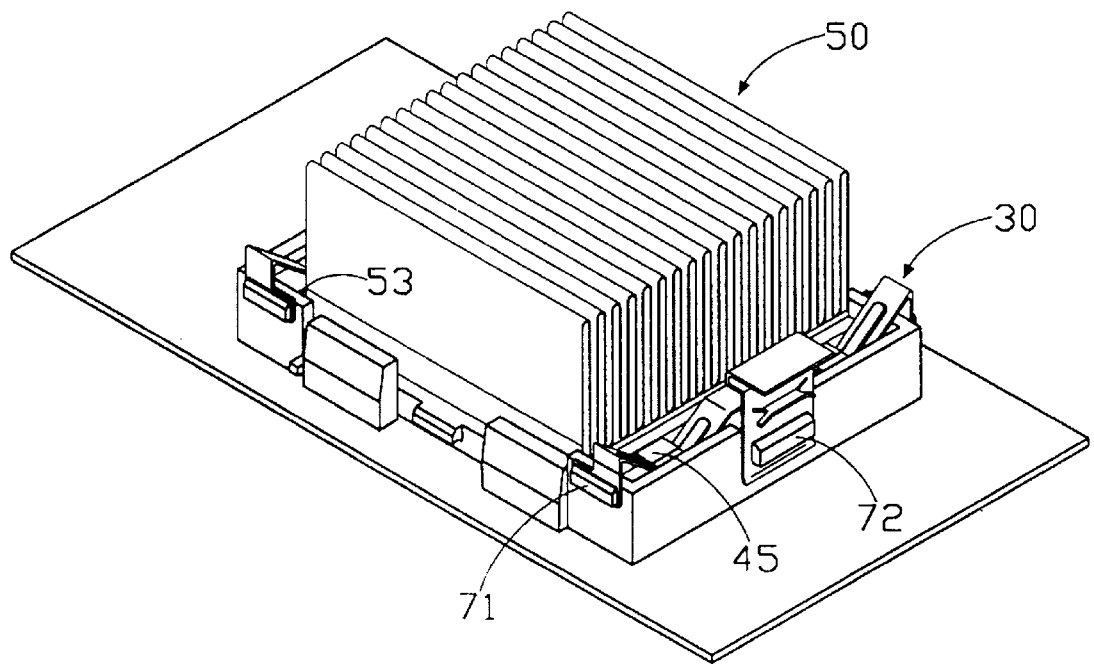
FIG. 4 is an assembled view of FIG. 3.

Referring to FIGS. 3–4, a heat sink 50 includes a chassis 51 adapted to be received between a pair of retention modules 70 (see below). The chassis 51 defines a pair of parallel slots 53 at opposite sides thereof. Thus a pair of shoulders 54 is formed in the chassis 51, each shoulder 54 being located between its adjacent slot 53 and the side of the chassis 51. A plurality of fins 52 extends upwardly from an upper surface of the chassis 51, between the slots 53.

Each retention module 70 forms an external catch 71 at each opposite end thereof. Each retention module 70 further forms an external clasp 72 at a center portion of an outer sidewall 74 thereof.

In assembly, an electronic device 90 is mounted on a circuit board 80. The retention modules 70 are mounted on the circuit board 80 by conventional means, one on each side of the electronic device 90. The heat sink 50 is placed on the electronic device 90 between the retention modules 70. The clips 30 are then attached to the respective retention modules 70. The apertures 491 of the legs 49 of each clip 30 engage with the catches 71 of the corresponding retention module 70. The handle 64 of each second fastener 60 is progressively pressed downwardly and slightly inwardly, causing a bottom portion (not labeled) of the vertical panel 61 to slide down over the outside of the clasp 72 of the corresponding retention module 70. The handle 64 is so pressed until the opening 62 of the second fastener 60 engagingly receives the clasp 72 of the retention module 70. Thus the heat sink 50 is securely and readily attached to the electronic device 90.

In this position, the horizontal portions 45 of each clip 30 press against the upper surface (not labeled) of the corresponding shoulder 54 of the heat sink 50. The pressing tabs 451 of the first fastener 40 of each clip 30 abut against the inner surface (not labeled) of the corresponding shoulder 53 of the heat sink 50. The second fastener 60 of the clip 30 is securely connected to the first fastener 40, which in turn is firmly secured to the clasp 72 of the retention module 70. Thus the heat sink 50 is prevented from moving in any direction.

To release each clip 30, the handle 64 of the second fastener 60 is pressed downwardly and slightly inwardly. This releases a bottom portion (not labeled) of the vertical panel 61 from contact with the clasp 72 of the retention module 70, and causes such bottom portion (not labeled) to move away from the outer sidewall 74 of the retention module 70. Thus the second fastener 60 is released from the clasp 72 of the retention module 70. The apertures 491 of the legs 49 of each clip 30 are then released from the catches 71 of the corresponding retention module 70. Thus each clip 30 is released from the retention module 70, and the heat sink 50 can be readily detached from the electronic device 90.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted between a pair of retention modules comprising:
    a first fastener including a body, a pair of legs extending from respective opposite ends of the body adapted for engaging with a retention module, and at least a stretch portion extending from the body; and
    a second fastener removably attached to the at least a stretch portion of the first fastener and adapted to engage with the retention module.

2. The clip as recited in claim 1, wherein the body comprises a plurality of spring pressing portions adapted for pressing the heat sink toward the electronic device.

3. The clip as recited in claim 2, wherein each pressing portion forms at least a pressing tab depending therefrom and adapted to be received in at least a slot defined in the heat sink.

4. The clip as recited in claim 2, wherein at least a rib is formed on each spring pressing portion to reinforce the clip.

5. The clip as recited in claim 1, wherein a plurality of cutouts is defined in the at least a stretch portion to form a pair of fixing tabs at respective opposite sides of the stretch portion, and wherein the second fastener forms at least a slot corresponding to and receiving the fixing tabs therethrough, the fixing tabs being thereupon deformed to retain the second fastener to the first fastener.

6. The clip as recited in claim 1, wherein the second fastener forms at least a handle for facilitating assembly and disassembly thereof.

7. The clip as recited in claim 1, wherein the stretch portion extends horizontally from the body.

8. A heat sink assembly comprising:
    an electronic device confined by a retention module;
    a heat sink positioned on the electronic device;
    a clip adapted to fasten the heat sink against the electronic device, said clip including:
        a first fastener defining a body with a pair of legs at two opposite ends thereof; and
        a second fastener pivotally positioned on one side of the body of the first fastener, said second fastener including a panel; wherein
            said pair of legs are respectively latchably engaged with two opposite sides of the retention module, while the panel is latchably engaged with another side of the retention module.

9. The heat sink assembly as recited in claim 8, wherein said body includes a stretch portion which is engaged with a top face of the heat sink when the panel of the second fastener is latched with the retention module while is disengaged from the top face of the heat sink when the panel of the second fastener is unlatched from the retention module.

10. A clip for securing a heat sink to an electronic device confined by a retention module, comprising:
    a first fastener including an elongated body with thereof a pair of legs downwardly extending from two opposite ends for latchable engagement with the retention module; and
    a second fastener pivotally attachably positioned on one side of the body between said pair of legs for latchable engagement with the retention module.

11. The clip as recited in claim 10, wherein at least one stretch portion of the body is positioned between the pair of legs for abutment against the heat sink.

12. The clip as recited in claim 11, wherein said at least one stretch portion is positioned between the second fastener and one of said pair of legs.

13. A heat sink assembly comprising:
    an electronic device confined by a retention module;
    a heat sink positioned on the electronic device;
    a clip adapted to fasten the heat sink against the electronic device, said clip including:
        a first fastener defining a body with a pair of legs at two opposite ends thereof, said body further defining a stretch portion between said pair of legs; and
        a second fastener pivotally attachably positioned on the body of the first fastener, said second fastener including a panel;
        said pair of legs are respectively latchably engaged with two opposite sides of the retention module; wherein
            when the panel is latchably engaged with another side of the retention module, the stretch portion abuts against the heat sink; when the panel is disengaged from said another side of the retention module, the stretch portion is spaced from the heat sink.

14. A method of assembling/disassembling a heat sink with regard to an electronic device, comprising the steps of:

providing an electronic device;

providing a retention module confining the electronic device;

positioning a heat sink on the electronic device;

providing a first fastener with a body having a stretch portion, and two legs at two ends thereof; and providing a second fastener rotatably attached to the first fastener, the second fastener having a panel; wherein during assembling, first the pair of legs are latchably engaged with two opposite sides of the retention module with the stretch portion spaced from the heat sink, and successively the panel is latchably engaged with another side of the retention module with the stretch portion abutting against the heat sink.

15. The method as recited in claim 14, wherein during disassembling, first the panel is manually operationally unlatched from said another side of the retention module and the heat sink is intermediately free from the electronic device due to relaxation of the stretch portion, and second successively the pair of legs are unlatched from the two opposite sides of the retention module for completely releasing the heat sink therefrom.

16. The method as recited in claim 14, wherein said another side is perpendicular to both said two opposite sides.

17. The method as recited in claim 14, wherein said second fastener includes a handle extending above the body.

* * * * *